(12) United States Patent
Stephani (10) Patent No.: US 7,325,092 B2
(45) Date of Patent: Jan. 29, 2008

(54) APPARATUS AND METHODS FOR A STATIC MUX-BASED PRIORITY ENCODER

(75) Inventor: Richard J. Stephani, St. Paul, MN (US)

(73) Assignee: LSI Corporation, Milpitas, CA (US)

( * ) Notice: Subject to any disclaimer, the term of this patent is extended or adjusted under 35 U.S.C. 154(b) by 141 days.

(21) Appl. No.: 11/192,580

(22) Filed: Jul. 30, 2005

(65) Prior Publication Data

US 2007/0028022 A1 Feb. 1, 2007

(51) Int. Cl.
 *G06F 12/00* (2006.01)
(52) U.S. Cl. .......................... 711/108; 711/220; 365/49
(58) Field of Classification Search ................ 711/108, 711/220; 365/49; 708/204
See application file for complete search history.

(56) References Cited

U.S. PATENT DOCUMENTS

| 4,586,036 A | * | 4/1986 | Thomason et al. ........... 345/24 |
| 4,875,180 A | * | 10/1989 | Kregness et al. ........... 708/204 |
| 7,043,601 B2 | * | 5/2006 | McKenzie et al. .......... 711/108 |

OTHER PUBLICATIONS

Philips Semiconductor, "74F148 8-input priority encoder", Data Sheet, 1990,10 pp. (http://www.standardics.nxp.com/products/fast/pdf/74f148.pdf, last accessed Mar. 19, 2007).*
Nave, Carl, "NAND gate", Georgia State University, 2001, 4 pp.*

* cited by examiner

*Primary Examiner*—Clifford Knoll
(74) *Attorney, Agent, or Firm*—Duft, Bornsen & Fishman LLP (57) ABSTRACT

Apparatus and methods for an improved priority encoder using only static circuit components. Features and aspects hereof rely exclusively on static logic circuits exclusive ROM and other memory structures as relied on in prior structures. The exemplary static circuit structures relied upon in accordance with features and aspects hereof are less susceptible to leakage current and other issues common in high density integrated circuit applications. Thus, features and aspects hereof avoid use of ROM and other similar memory devices in favor of digital encoders comprised of static logic circuits cascaded through multiplexers to provide priority encoding in digital circuit applications coupling multiple devices to a shared, common bus structure.

3 Claims, 4 Drawing Sheets

APPARATUS AND METHODS FOR A STATIC MUX-BASED PRIORITY ENCODER

BACKGROUND OF THE INVENTION

1. Field of the Invention

The invention relates to circuits and methods for priority encoding. More specifically, the invention relates to a priority encoder implemented exclusively with static circuits devoid of ROM or other memory circuit components.

2. Discussion of Related Art

A wide variety of electronic systems utilize bus structures in which multiple devices communicate via a shared bus. The bus may comprise a plurality of signal paths for exchanging discrete signals and/or may comprise serial communication pass in which multiple signals are transmitted sequentially over the serial signal paths. In such shared bus structures, the multiple devices generally arbitrate for temporary exclusive control of the shared bus structure. Thus, one device (often referred to as a master device) may initiate communications with one or more other devices coupled to the shared bus structure.

Typically in such a system, a device referred to as an arbiter or arbitrator may determine which of multiple master devices may be granted requested temporary control of the shared bus structure. A common approach for designing such an arbiter includes a priority encoder that receives multiple request or hitlines signal paths often from a content addressable memory ("CAM") or other signal sources. Each signal, regardless of the source, may represent one of multiple master devices sharing the common bus structure and requesting temporary exclusive access. The priority encoder then determines from the multiple request signal paths which device is to be granted the requested temporary exclusive control. Such an arbiter in a shared bus structure is but one exemplary application of such a priority encoder circuit. Those of ordinary skill in the art will recognize a wide variety of other applications and systems that may beneficially apply a priority encoder circuit.

A common application using such priority encoder circuits utilizes a content addressable memory (CAM). A CAM is used to compare a multiple bit input word signal to all multiple bit words stored in the CAM. The output of the CAM indicates the location of the matching word or words—i.e., one "hitline" per matching word of the CAM. Typically, the output of the CAM device is applied to a prioritizer that selects the highest priority hitline that is presently active in the output bits of the CAM. The highest priority bit is then applied to a ROM the output of which indicates the encoded index value of the identified highest priority active hitline. The prioritizer and ROM thereby translate the CAM output into a corresponding encoded address for the highest priority hitline—e.g., the highest priority device presently requesting temporary exclusive access to the shared bus.

As semiconductors fabrication techniques further reduce the size of circuit structures and spacing of interconnecting signal paths within integrated circuits, known priority encoders using ROM devices have become problematic. For example many present day semiconductor fabrication technologies produce component sizes and signal path traces approaching 90 nm or less. With such high density circuits, circuit designs have to account more specifically for channel leakage associated with the decreased size of circuits within an integrated circuit die. ROM devices in particular suffer from this channel leakage problem and hence present increased problems for present-day integrated circuit designs with ROM based priority encoders.

It is evident from the above discussion that a need exists for improved circuit structures and methods for priority encoding that avoids utilization of ROM structures susceptible to channel leakage and other problems as integrated circuit density continues to increase.

SUMMARY OF THE INVENTION

The present invention solves the above and other problems, thereby advancing the state of the useful arts, by providing priority encoder circuits utilizing only static logic to implement a priority encoder. In particular, features and aspects hereof implement a priority encoder without reliance on a ROM structure or other lookup table memory structures. Rather, features and aspects hereof utilize simpler static, combinatorial logic circuits plus standard multiplexer devices to provide a simple priority encoder less susceptible to channel leakage as compared to ROM or other memory structures relied on previously for priority encoders.

A first feature hereof provides a priority encoder circuit comprising: a plurality of hitline input signal paths where the number (N) of hitline input signal paths is a non-zero integer greater than 1 and wherein the plurality of hitline input signal paths have a priority sequence associated therewith; a HIT output signal path on which a hit signal is applied indicating that at least one of the plurality of hitline input signal paths has received an active hitline input signal; an encoded address output signal path comprising a number (M) of output signals on which an encoded address is applied representing a binary encoded index value indicative of which of the N hitline input signal paths has received an active hitline input signal; and logic circuits coupled to receive the plurality of hitline input signal paths and coupled to generate the encoded address and coupled to apply the generated encoded address to the encoded address output signal path, wherein the logic circuits consist essentially of multiplexers and combinatorial logic.

Another aspect hereof further provides that the number (N) of hitline input signal paths is a non-zero, integral power of 2.

Another aspect hereof further provides that the number (M) of encoded address signals is log2 (N).

Another aspect hereof further provides that the logic circuits are configured such that when multiple hitline input signals are presently active on the plurality of hitline input signal paths the logic circuits generate the encoded address of the highest priority signal of the multiple hitline input signals.

Another aspect hereof further provides that the logic circuits are arranged as a plurality of hierarchical layers.

Another aspect hereof further provides that a first layer circuit of the plurality of hierarchical layers further comprises: a NOR logic gate having a first input signal path coupled to a higher priority hitline input signal path (HL0) and having a second input signal path coupled to a lower priority hitline input signal path (HL1) and having an output signal path on which is applied the inverted Boolean logical OR of signals on the two input signal paths as a negated hit signal (HITN) indicative that at least one of the first and second input signal paths has a corresponding active hitline signal applied thereto; and an output signal path (ENCAN) coupled to HL0 to generate an inverted 1-bit encoded address signal indicating the binary encoded index value of the highest priority hitline input signal path from among HL0 and HL1 that is presently active.

Another aspect hereof further provides that the plurality of hierarchical layers further comprises: a pair of first layer circuits wherein the first circuit of the pair of first layer circuits has a higher priority hitline input signal path (HL0) and a lower priority hitline input signal path (HL1) and wherein the second circuit of the pair has a higher priority hitline input signal path (HL2) and a lower priority hitline input signal path (HL3) and wherein both HL2 and HL3 are lower in priority than HL1; and a second layer circuit coupled to the logic circuits of each of the pair of first layer circuits and configured to generate a 2-bit encoded address indicating the binary encoded index value of the highest priority hitline input signal path from among HL0, HL1, HL2, and HL3 that is presently active, wherein the second layer circuit further comprises: a first multiplexer having a first input signal path coupled to a constant logic high signal and having a second input signal path coupled to a constant logic low signal and having a selection input signal path coupled to the HITN of the first circuit of the pair of first layer circuits and having an output signal path on which is applied the selected input signal as a high order bit (ENCA1) of the 2-bit encoded address; a second multiplexer having a first input signal path coupled to receive the ENCAN signal of the first circuit of the pair of first layer circuits and having a second input coupled to receive the ENCAN signal of the second circuit of the pair of first layer circuits and having a selection input signal path coupled to the HITN of the first circuit of the pair of first layer circuits and having an output signal path on which the selected input signal is applied as a low order bit (ENCA0) of the 2-bit encoded address; and a NAND gate having a first input signal path coupled to the HITN signal of the first circuit of the pair of first layer circuits and a having a second input signal path coupled to the HITN signal of the second circuit of the pair of first layer circuits and having an output signal path (HIT) on which the Boolean inverted logical AND of the two input signals is applied as a hit signal indicating a valid encoded address is applied to ENCA0 and ENCA1.

Another aspect hereof further provides that the plurality of hierarchical layers further comprises: a pair of second layer circuits wherein the first circuit of the pair of second layer circuits has a highest priority hitline input signal path (HL0) and a next lower priority hitline input signal path (HL1) and a next lower priority hitline input signal path (HL2) and a next lower priority hitline input signal path (HL3) and wherein the second circuit of the pair of second layer circuits has a highest priority hitline input signal path (HL4) and a next lower priority hitline input signal path (HL5) and a next lower priority hitline input signal path (HL6) and a next lower priority hitline input signal path (HL7) and wherein HL4, HL5, HL6, and HL7 are all lower in priority than HL3; and a third layer circuit coupled to the logic circuits of each of the pair of second layer circuits and configured to generate a 3-bit encoded address indicating the binary encoded index value of the highest priority hitline input signal path from among HL0, HL1, HL2, HL3, HL4, HL5, HL6, and HL7 that is presently active, wherein the third layer circuit further comprises: a first multiplexer having a first input signal path coupled to a constant logic high signal and having a second input signal path coupled to a constant logic low signal and having a selection input signal path coupled to the HIT of the first circuit of the pair of second layer circuits and having an output signal path on which is applied the selected input signal as an inverted high order bit (ENCAN2) of the 3-bit encoded address; a second multiplexer array having first input signal paths coupled to receive the ENCA0 and ENCA1 signals of the first circuit of the pair of second layer circuits and having a second input coupled to receive the ENCA0 and ENCA1 signals of the second circuit of the pair of second layer circuits and having a selection input signal path coupled to the HIT output signal path of the first circuit of the pair of second layer circuits and having an output signal path on which the selected input signals are applied as inverted low order bits (ENCAN0 and ENCAN1) of the 3-bit encoded address; and a NOR gate having a first input signal path coupled to the HIT signal of the first circuit of the pair of second layer circuits and a having a second input signal path coupled to the HIT signal of the second circuit of the pair of second layer circuits and having an output signal path (HITN) on which the Boolean inverted logical OR of the two input signals is applied as a hit signal indicating a valid encoded address is applied to ENCAN0, ENCAN1, and ENCAN2.

Another aspect hereof further provides that the plurality of hierarchical layers further comprises: a pair of third layer circuits wherein the first circuit of the pair of third layer circuits has hitline input signal paths HL0 through HL7 ordered from highest to lower priority and wherein the second circuit of the pair of third layer circuits has hitline input signal paths HL8 through HL15 ordered from higher to lower priority wherein HL8 through HL15 are all lower in priority than HL7; and a fourth layer circuit coupled to the logic circuits of each of the pair of third layer circuits and configured to generate a 4-bit encoded address indicating the binary encoded index value of the highest priority hitline input signal path from among HL0 through HL15 that is presently active, wherein the fourth layer circuit further comprises: a first multiplexer having a first input signal path coupled to a constant logic high signal and having a second input signal path coupled to a constant logic low signal and having a selection input signal path coupled to the HITN of the first circuit of the pair of third layer circuits and having an output signal path on which is applied the selected input signal as a high order bit (ENCA3) of the 4-bit encoded address; a second multiplexer array having first input signal paths coupled to receive the ENCAN0, ENCAN1, and ENCAN2 signals of the first circuit of the pair of third layer circuits and having second input signal paths coupled to receive the ENCAN0, ENCAN1, and ENCAN2 signals of the second circuit of the pair of third layer circuits and having a selection input signal path coupled to the HITN of the first circuit of the pair of third layer circuits and having an output signal path on which the selected input signals are applied as low order bits (ENCA0 through ENCA2) of the 4-bit encoded address; and a NAND gate having a first input signal path coupled to the HITN signal of the first circuit of the pair of third layer circuits and a having a second input signal path coupled to the HITN signal of the second circuit of the pair of third layer circuits and having an output signal path (HIT) on which the Boolean inverted logical AND of the two input signals is applied as a hit signal indicating a valid encoded address is applied to ENCA0 through ENCA3.

Another feature hereof provides a circuit comprising: a 2-bit priority encoder circuit comprising: a low priority hitline input signal path adapted to receive a corresponding low priority hitline signal (HL1) from an external source; a high priority hitline input signal path adapted to receive a corresponding high priority hitline signal (HL0) from an external source; an output signal path coupled to HL1 as an inverted encoded address value (ENCAN); and a NOR gate having a first input signal path coupled to HL1 and having a second input signal path coupled to HL0 and having an output signal path (HITN) on which the Boolean inverted logical OR of the two input signals is applied as an inverted hit signal indicating a valid encoded address is applied to ENCAN.

Another aspect hereof further provides a second 2-bit priority encoder circuit having identical structure to that of the first 2-bit priority encoder circuit wherein the low priority hitline input signal path of the second 2-bit priority encoder circuit is coupled to a next lower priority hitline signal (HL2) having a priority lower than HL0 and HL1 and wherein the high priority hitline input signal path is coupled to a next lower priority hitline signal (HL3) having a priority lower than HL0, HL1, and HL2; a first multiplexer having a first input signal path coupled to a constant logic high signal and having a second input signal path coupled to a constant logic low signal and having a selection input signal path coupled to the HITN of the first 2-bit priority encoder circuit and having an output signal path on which is applied the selected input signal as a high order bit (ENCA1) of a 2-bit encoded address; a second multiplexer having a first input signal path coupled to receive the ENCAN signal of the first 2-bit priority encoder circuit and having a second input coupled to receive the ENCAN signal of the second 2-bit priority encoder circuit and having a selection input signal path coupled to the HITN of the first 2-bit priority encoder circuit and having an output signal path on which the selected input signal is applied as a low order bit (ENCA0) of the 2-bit encoded address; and a NAND gate having a first input signal path coupled to the HITN signal of the first 2-bit priority encoder circuit and a having a second input signal path coupled to the HITN signal of the second 2-bit priority encoder circuit and having an output signal path (HIT) on which the Boolean inverted logical AND of the two input signals is applied as a hit signal indicating a valid encoded address is applied to ENCA0 and ENCA1.

Another aspect hereof further provides that the combination of the first and second 2-bit priority encoder circuits comprises a first 4-bit priority encoder circuit configured to receive HL0 through HL3 as input signals and configured for generating ENCA0-ENCA1 as a 2-bit encoded address therefrom and configured for generating HIT asserted logical high when a valid 2-bit address is applied to ENCA0-ENCA1, and further provides that the circuit further comprises: a second 4-bit priority encoder circuit having identical structure to that of the first 4-bit priority encoder circuit wherein the hitline input signal paths of the second 4-bit priority encoder circuit are each coupled to a corresponding hitline of a plurality of hitlines (HL4 . . . HL7) ordered from higher priority to lower priority and each having lower priority than the HL3 input signal; a first multiplexer having a first input signal path coupled to a constant logic high signal and having a second input signal path coupled to a constant logic low signal and having a selection input signal path coupled to the HIT signal of the first 4-bit priority encoder circuit and having an output signal path on which is applied the selected input signal as a high order bit (ENCAN2) of a 3-bit encoded address; a second multiplexer array having a first input signal bus path coupled to receive the ENCA0 and ENCA1 signals of the first 4-bit priority encoder circuit and having a second input signal bus path coupled to receive the ENCA0 and ENCA1 signals of the second 4-bit priority encoder circuit and having a selection input signal path coupled to the HIT signal of the first 4-bit priority encoder circuit and having an output signal path on which the selected input signals are applied as low order bits (ENCAN0 and ENCAN1) of the 3-bit encoded address; and a NOR gate having a first input signal path coupled to the HIT signal of the first 4-bit priority encoder circuit and a having a second input signal path coupled to the HIT signal of the second 4-bit priority encoder circuit and having an output signal path (HITN) on which the Boolean inverted logical OR of the two input signals is applied as a hit signal indicating a valid encoded address is applied to ENCAN0 through ENCAN2.

Another aspect hereof further provides that the combination of the first and second 4-bit priority encoder circuits comprises a first 8-bit priority encoder circuit configured to receive HL0 through HL7 as input signals and configured for generating ENCAN0-ENCAN2 as a 3-bit encoded address therefrom and configured for generating HITN asserted logical high when a valid 3-bit address is applied to ENCAN0-ENCAN2, and provides that the circuit further comprises: a second 8-bit priority encoder circuit having identical structure to that of the first 8-bit priority encoder circuit wherein the hitline input signal paths of the second 8-bit priority encoder circuit are each coupled to a corresponding hitline of a plurality of hitlines (HL8 . . . HL15) ordered from higher priority to lower priority and each having lower priority than the HL8 input signal; a first multiplexer having a first input signal path coupled to a constant logic high signal and having a second input signal path coupled to a constant logic low signal and having a selection input signal path coupled to the HITN signal of the first 8-bit priority encoder circuit and having an output signal path on which is applied the selected input signal as a high order bit (ENCA3) of a 4-bit encoded address; a second multiplexer array having a first input signal bus path coupled to receive the ENCAN0-ENCAN2 signals of the first 8-bit priority encoder circuit and having a second input signal bus path coupled to receive the ENCAN0 through ENCAN2 signals of the second 8-bit priority encoder circuit and having a selection input signal path coupled to the HITN signal of the first 8-bit priority encoder circuit and having an output signal path on which the selected input signals are applied as low order bits (ENCA0 . . . ENCA2) of the 4-bit encoded address; and a NAND gate having a first input signal path coupled to the HITN signal of the first 8-bit priority encoder circuit and a having a second input signal path coupled to the HITN signal of the second 8-bit priority encoder circuit and having an output signal path (HIT) on which the Boolean inverted logical AND of the two input signals is applied as a hit signal indicating a valid encoded address is applied to ENCA0 through ENCA3.

Another feature hereof provides a system comprising: a content addressable memory adapted to generate signals applied to a plurality of hitline signal paths each configured to indicate a hit for a corresponding location of the content addressable memory; and priority encoder means coupled to receive the plurality of hitline signal paths for generating an encoded address representing an index value of a presently active hitline signal applied to the plurality of hitline signal paths.

Another aspect hereof further provides that the priority encoder means further comprises a plurality of layered logic means.

Another aspect hereof further provides that the plurality of layered logic means includes a first logic layer means comprising: first layer encoding means coupled to a pair of hitlines of the plurality of hitline signal paths for generating a 1-bit encoded address value wherein the pair of hitlines include a higher priority hitline and a lower priority hitline and wherein the 1-bit encoded address value is indicative of the highest priority of the pair of hitlines that is presently active; and first layer hit signal means coupled to the pair of hitlines for generating a signal indicative that at least one of the pair of hitlines is presently active.

Another aspect hereof further provides that the plurality of logic layer means further includes a second logic layer means comprising: second layer encoding means coupled to a pair of first layer logic means for generating a 2-bit encoded address value wherein the pair of first logic layer means includes a higher priority first logic layer means and a lower priority first logic layer means and wherein the 2-bit encoded address value is indicative of the highest priority hitline of the hitlines associated with the pair of first logic layer means that is presently active; and second layer hit signal means coupled to the pair of first logic layer means for generating a signal indicative that at least one of the hitlines associated with the pair of first logic layer means is presently active.

Another aspect hereof further provides that the plurality of logic layer means further includes a third logic layer means comprising: third layer encoding means coupled to a pair of second layer logic means for generating a 3-bit encoded address value wherein the pair of second logic layer means includes a higher priority second logic layer means and a lower priority second logic layer means and wherein the 3-bit encoded address value is indicative of the highest priority hitline of the hitlines associated with the pair of second logic layer means that is presently active; and third layer hit signal means coupled to the pair of second logic layer means for generating a signal indicative that at least one of the hitlines associated with the pair of second logic layer means is presently active.

Another aspect hereof further provides that the plurality of logic layer means further includes a fourth logic layer means comprising: fourth layer encoding means coupled to a pair of third layer logic means for generating a 3-bit encoded address value wherein the pair of third logic layer means includes a higher priority third logic layer means and a lower priority third logic layer means and wherein the 3-bit encoded address value is indicative of the highest priority hitline of the hitlines associated with the pair of third logic layer means that is presently active; and fourth layer hit signal means coupled to the pair of third logic layer means for generating a signal indicative that at least one of the hitlines associated with the pair of third logic layer means is presently active.

Another aspect hereof further provides that the plurality of logic layer means further includes a plurality of higher logic layer means wherein each higher layer logic means is coupled elements of a next lower logic layer of the plurality of higher layer logic means and wherein each higher layer logic means comprises: encoding means coupled to a pair of the next lower layer logic means for generating a multi-bit encoded address value wherein the pair of next lower logic layer means includes a higher priority next lower logic layer means and a lower priority next lower logic layer means and wherein the multi-bit encoded address value is indicative of the highest priority hitline of the hitlines associated with the pair of next lower logic layer means that is presently active; and hit signal means coupled to the pair of next lower logic layer means for generating a signal indicative that at least one of the hitlines associated with the pair of next lower logic layer means is presently active.

DETAILED DESCRIPTION OF THE DRAWINGS

Figure 1:
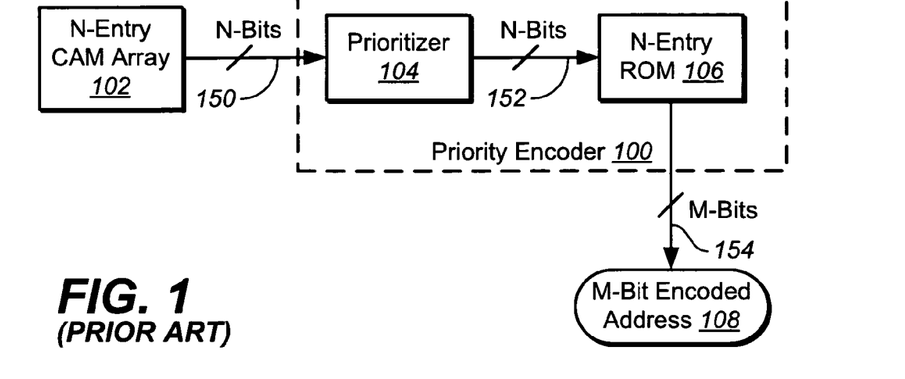
FIG. 1 is a block diagram of a priority encoder relying on ROM structures as presently practiced in the art.

FIG. 1 is a block diagram of a priority encoder 100 as presently practiced in the art. An N-entry content addressable memory array 102 produces a plurality of hitlines generated by an output word (comprising N bits) applied to path 150 and corresponding to an input applied to the CAM array 102. The N hitline signals on path 150 are applied to priority encoder 100 to produce an M-bit encoded address 108 applied as an output on path 154.

In accordance with presently known priority encoder architectures, a prioritizer 104 receives the N hitline bits via path 150 and applies N signals via path 152 to an N-entry ROM 106. Prioritizer 104 receives the hitline signals output from the CAM array 102 and produces a prioritized set of equivalent hitline signals with only the highest priority presently active hitline asserted as output from the prioritizer 104. These prioritized hitline signals on path 152 are applied as a word line input to the N-entry ROM 106. ROM 106 then generates as its output the corresponding memory value representing the encoded address of the asserted word line. The encoded word address typically represents a binary encoded index value identifying which of the N prioritized hitlines on path 152 is presently asserted.

In this presently known architecture, the prioritizer 104 is typically implemented using simple static, combinatorial logic components. However, ROM 106 presents difficulties as discussed above as technology advancements reduce circuit sizes and trace spacing. Circuit leakage problems may preclude practical, simple implementations of such known priority encoder architectures.

Figure 2:
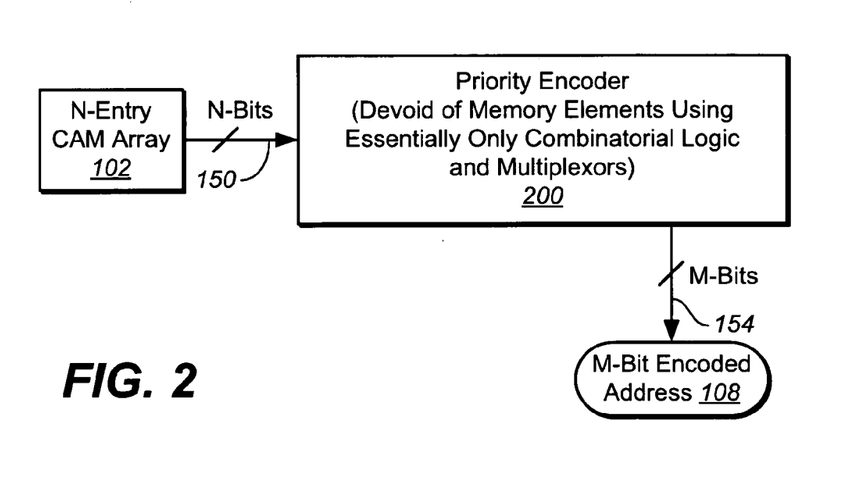
FIG. 2 is a block diagram of an exemplary embodiment of a priority encoder devoid of ROM or other memory structures in accordance with features and aspects hereof.

FIG. 2 is a block diagram describing an exemplary improved priority encoder 200 in accordance with features and aspects hereof. Priority encoder 200 may be implemented utilizing exclusively static, combinatorial logic and associated multiplexers—devoid of any memory component such as ROM 106 of FIG. 1. Priority encoder 200 of FIG. 2 is therefore substantially immune from the problems discussed above with high density circuit channel leakage and ROM or other memory structure designs associated with previous priority encoders. Priority encoder 200 therefore provides a simple priority encoder architecture that permits implementation utilizing high density semiconductor architectures and fabrication techniques. More specifically, priority encoder 200 receives an N-bit word on path 150 generated by, for example, an N-entry CAM array 102 and produces an M-bit encoded address 108 applied to path 154 for further utilization. As above, the M-bit encoded address 108 may be a binary encoded index value indicating the highest priority presently active bit of the N-bit word on path 150. Also as note above, CAM 102 is but one exemplary device or system that may generate a plurality of hitlines to be applied to priority encoder 200. A variety of other signal sources will be readily apparent to those of ordinary skill in the art.

Figure 3:
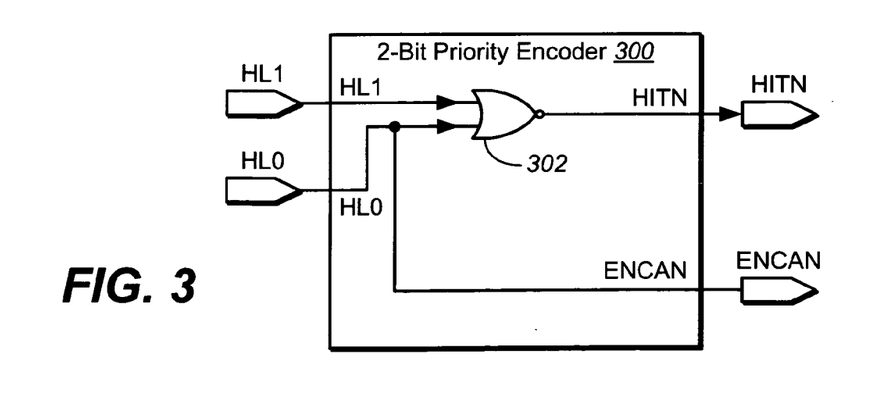
FIGS. 3-6 are circuit diagrams depicting exemplary hierarchically layered logic circuits providing an exemplary embodiment of features and aspects hereof.
Figure 4:
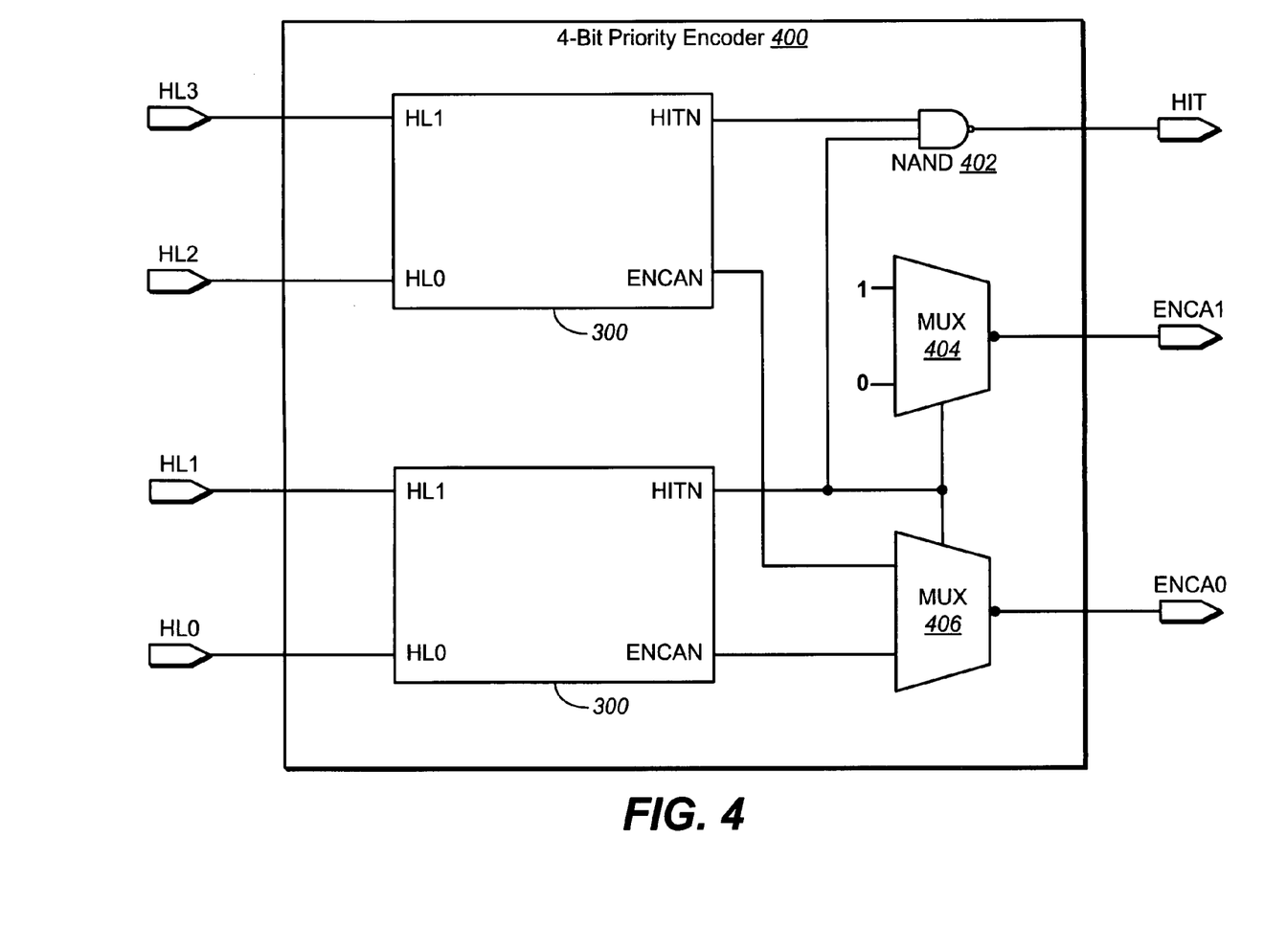
Figure 5:
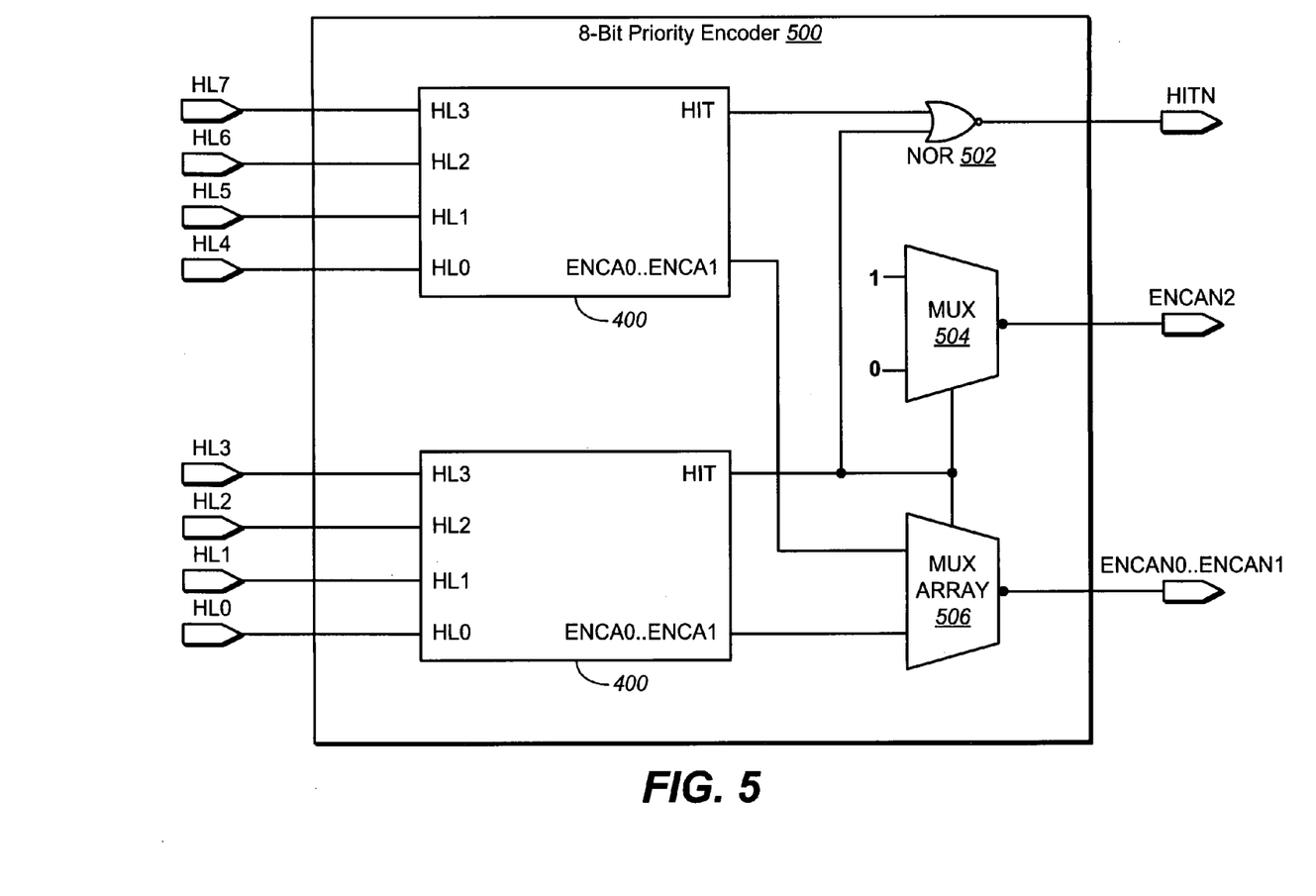
Figure 6:
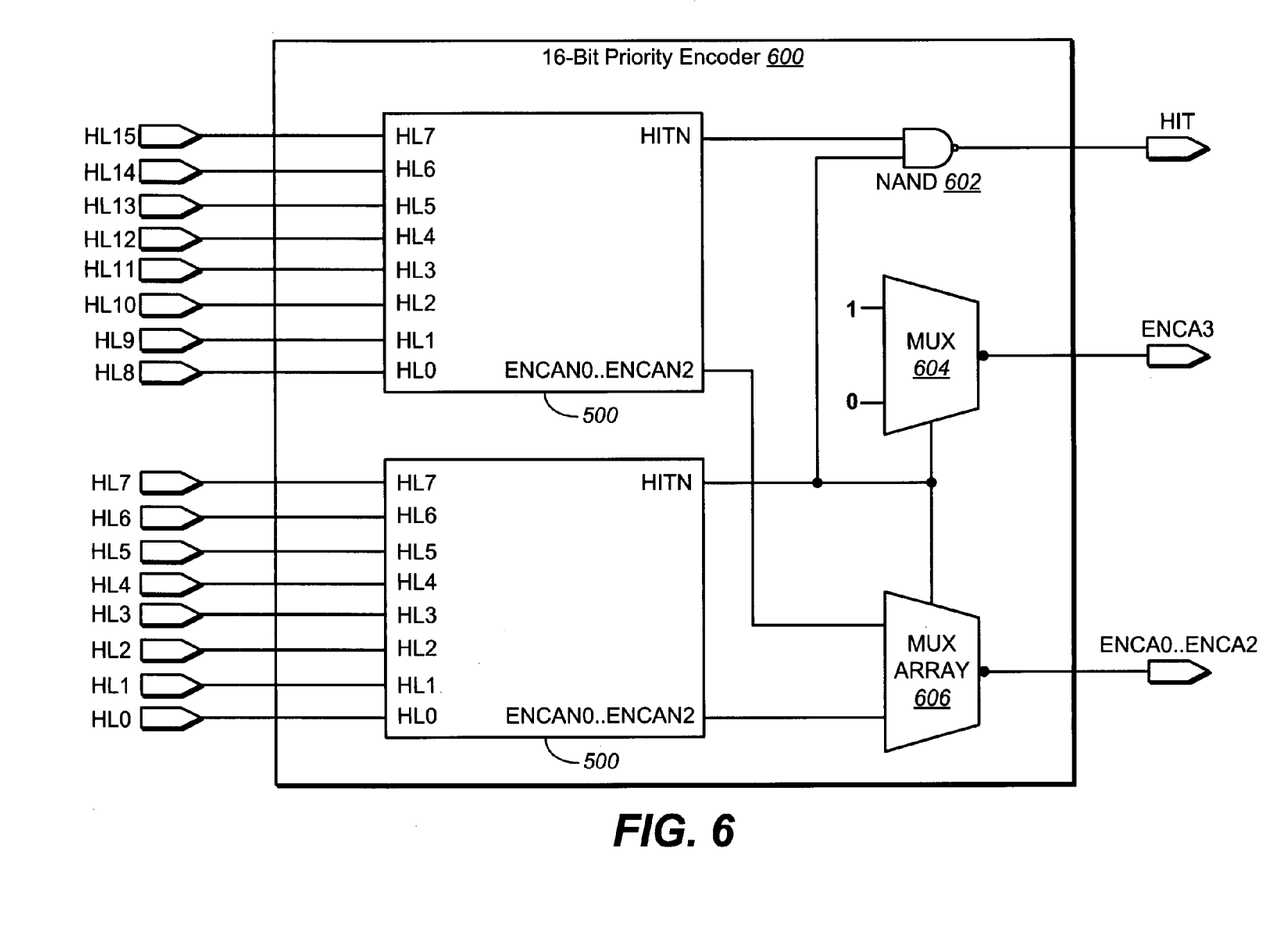

An exemplary embodiment of priority encoder 200 in accordance with features and aspects hereof is provided collectively by FIGS. 3 through 6. In this exemplary embodiment, priority encoder 200 may comprise a plurality of hierarchically arranged layers of logic circuits. The logic circuits may comprise static, combinatorial circuits and multiplexing circuits but is substantially devoid of any ROM or other memory structures that give rise to problems of prior techniques. An exemplary first or lowest hierarchical layer of the exemplary embodiment is shown in FIG. 3. Second, third, and forth exemplary hierarchical layers representing higher order structures are shown in FIGS. 4-6, respectively, each building on lower layers of logic. The collection of FIGS. describes at the highest layer (FIG. 6) a 16-bit priority encoder. FIGS. 5, 4, and 3 show 8-bit, 4-bit and 2-bit priority encoders, respectively, in accordance with features and aspects hereof. The exemplary 16-bit priority encoder of FIG. 6 receives 6teen hitline signals from an external source (e.g., from CAM array 102 of FIG. 2) and generates a corresponding 4-bit binary encoded address value representing the index value (0 through 15) of the highest priority hitline received as input.

Those of ordinary skill in the art will readily understand that such a hierarchical layering of circuits may be understood either by describing the lowest layers up to the highest layers or by describing the highest layers down to the lowest layers. The ordering of layers in such a description is irrelevant to an understanding of the layered architecture for those of ordinary skill and the art. As described herein, FIGS. 3 through 6 describe the lowest layers of the exemplary hierarchy up to higher layers of the hierarchy. Most generally, the features and aspects hereof provide for a priority encoder that receives a plurality (N) of hitlines as input signals and generates an M-bit encoded address value. Preferably, the encoded address value may be a binary encoded value and thus the number of hitline input signals may be a power of 2 and the number of bits in the encoded address may be determined as the log base 2 of N (M=log$_2$N). The priority encoder features and aspects hereof provide the desired encoding functions utilizing only static combinatorial logic circuits and multiplexing circuits devoid of ROM or other memory structures.

FIG. 3 is a circuit diagram of an exemplary 2-bit priority encoder in accordance with features and aspects hereof. 2-bit priority encoder 300 receives two input signals: namely, HL0 representing a higher priority hitline input signal and HL1 representing a lower priority hitline. One or both of the input signal paths may receive an active hitline signal from the external source (e.g., a CAM array as depicted in FIG. 2 above). The higher priority hitline signal HL0 and lower priority hitline signal HL1 are both applied as inputs to NOR gate 302. NOR gate 302 generates the inverted Boolean logical or of the two input signals and applies the generated signal as an output signal (HITN) indicating that at least one of the hitline input signals has a presently active signal applied thereto.

2-bit priority encoder 300 also generates an inverted 1-bit encoded address (ENCAN) representing the binary encoded index value of the hitline input signal on which the higher priority input signal has been sensed. In this exemplary 2-bit priority encoder, the inverted encoded address (ENCAN) may be generated simply as the non-inverted HL0 input signal.

2-bit priority encoder 300 therefore simply operates by asserting the HITN signal and applies the binary encoded value index value ENCAN indicating which of the two input signal paths has the higher priority hitline signal presently asserted thereon.

For simplicity of this and subsequent circuit diagrams, ubiquitous clocking, power plane, and ground plane signals are removed for purposes of this description. Those of ordinary skill in the art will readily recognize that such common signals may be applied as required.

FIG. 4 represents a second layer circuit comprising a pair of first layer circuits (such as the exemplary 2-bit encoder 300 of FIG. 3) combined to form a 4-bit priority encoder. By combining a pair of such a first layer circuits, a 4-bit priority encoder 400 may be implemented with the addition of one more logic gate and two multiplexer circuits. Thus 4-bit encoder 400 receives four hitline signals (HL0, HL1, HL2, and HL3) and generates a 2-bit binary encoded address value (non-inverted signals ENCA0 and ENCA1) as well as a non-inverted hit signal (HIT) indicating that a properly encoded address is presently applied to the non-inverted encoded address. More specifically, 4-bit priority encoder 400 includes two structurally identical 2-bit priority encoders 300. A first 2-bit priority encoder 300 receives 2 hitline input signals HL0 and HL1 applied to its corresponding hitline input signal pads HL0 and HL1 thus producing a 1-bit encoded address signal ENCAN and output signal HITN. The second 2-bit priority encoder 300 receives two line input signals HL2 and HL3 on its input signal paths HL0 and HL1, respectively. This second 2-bit encoder 300 then produces its encoded address as ENCAN and its hit signal as HITN.

The inverted hit signals of each of the first layer logic 2-bit encoders 300 are applied as inputs to NAND gate 402 which, in turn, generates the inverted Boolean AND of its two inputs and applies the generated signal as an output signal HIT. The HIT signal is indicative that at least one of the four hitline inputs (HL0 through HL3) has a presently active signal asserted thereon. A first multiplexer 404 receives a constant logic level 1 and a constant logic level 0 as its two inputs and applies a selected one of the two inputs as an inverted highest order bit of a 2-bit encoded address value (ENCA1). The HITN output signal of the first 2-bit priority encoder 300 of the pair is also applied as a selection input signal for multiplexer 404. A second multiplexer 406 utilizes the same HITN signal of the first 2-bit priority encoder 300 of the pair as its selection input. The second multiplexer 406 receives the inverted 1-bit encoded address (ENCAN) of each of the pair of first layer circuits and applies the selected input as a non-inverted low order bit of the 2-bit encoded address (ENCA0).

Thus, using only static, combinatorial logic and multiplexing devices, a second layer 4-bit priority encoder 400 generates a 2-bit encoded address derived from the four hitline signals applied to thereto.

FIG. 5 is a circuit diagram of an exemplary third layer circuit (8-bit priority encoder) that comprises a pair of second layer circuits (e.g., a pair of 4-bit encoders 300 as described above with respect to FIG. 4). Similar to the structure described above, the 8-bit priority encoder 500 of FIG. 5 has a first 4-bit priority encoder 400 receiving higher priority hitlines HL0 through HL3 and generating a non-inverted 2-bit encoded address value ENCA0 and ENCA1 along with a corresponding non-inverted HIT signal. Further, similar to the structure of FIG. 4, a second circuit of the pair of second layer logic circuits provides another 4-bit priority encoder 400 receiving four lower priority input hitline signals HL4 through HL7 applied to its corresponding HL0 through HL3 input signal paths, respectively. It likewise generates non-inverted 2-bit encoded address signals ENCA0 and ENCA1 plus its corresponding HIT signal value. The non-inverted HIT signals from each of the pair of second layer 4-bit priority encoders 400 are applied as inputs to NOR gate 502. NOR gate 502 then generates the inverted Boolean logical OR of its two input signals to generate an inverted HITN signal for the 8-bit priority encoder 500. As above, the inverted HITN signal indicates that any one of the eight hitline input signal paths (HL0 through HL7) has a presently active signal applied thereto. A first multiplexer 504, as above in FIG. 4, receives a constant logic level 1 and a constant logic level 0 as its two inputs and applies a selected input as an inverted high order bit of a 3-bit encoded address (ENCAN2). The HIT signal of the first 4-bit priority encoder 400 is used as a selection input for the first multiplexer 504. Further, as above and FIG. 4, a second multiplexer array 506 selects the lower order encoded address bits (e.g., an array of multiplexers operable in parallel to select between alternate signals for a multi-bit bus signal). A first input to multiplexer 506 is the 2-bit, non-inverted encoded address ENCA0 and ENCA1 of the first 4-bit encoder 400. A second input to multiplexer 506 is the 2-bit encoded address ENCA0 and ENCA1 of the second 4-bit priority encoder 400. The HIT signal of the first 4-bit encoder 400 is also used as the selection input for all multiplexers of multiplexer array 506. Multiplexer array 506 then applies the selected input signals as inverted lower order bits of the 3-bit encoded address, namely, ENCAN0 and ENCAN1.

Multiplexer array 506 and similar multiplexer array structures described herein may also be referred to simply as "multiplexer". Those of ordinary skill in the art will readily recognize that a multiplexer array adapted to select a plurality of signals in parallel may be more easily drawn and described a single multiplexer device. Thus as used herein, "multiplexer" and "multiplexer array" may be considered synonymous in reference to selection of multi-bit signals being selected for application to a multi-bit output signal path.

FIG. 5 therefore represents an exemplary third layer 8-bit priority encoder implemented utilizing only combinatorial logic circuits and simple multiplexing devices devoid of ROM or other memory structures. More specifically, the third layer logic structure of FIG. 5 utilizes a pair of 4-bit priority encoders such as that of FIG. 4 to generate a 3-bit encoded address indicative of an index value for the highest priority input signal path from among HL0 through HL7 applied as input signals to the 8-bit priority encoder 500.

FIG. 6 is a circuit diagram of an exemplary 16-bit priority encoder implemented as a fourth layer logic device utilizing a pair of 8-bit priority encoders as described above for example in FIG. 5. In particular, 16-bit priority encoder 600 implemented as a fourth layer logic device may include a pair of third layer logic devices that comprise that each comprises an 8-bit priority encoder 500. The first 8-bit priority encoder 500 receives higher priority hitline input signals HL0 through HL7 and generates an inverted 3-bit, inverted encoded address as ENCAN0 through ENCAN2. The first 8-bit priority encoder 500 also generates an inverted hit signal (HITN) indicative of one of the higher priority hitlines HL0 through HL7 having a presently active signal applied thereto. The second 8-bit priority encoder 500 receives lower priority hitline signals HL8 through HL15 applied to its HL0 through HL7 input signal paths, respectively. The second 8-bit priority encoder 500 then generates a corresponding 3-bit, inverted encoded address signal has ENCAN0 through ENCAN2. Further, the second 8-bit priority encoder 500 generates an inverted hit signal (HITN) indicating that at least one of its hitline input signal paths HL0 through HL7 has a presently active signal applied thereto. As above with respect to FIGS. 4 and 5, the inverted hit signals (HITN) of both third layer logic 8-bit priority encoders 500 are applied as inputs to NAND gate 602. NAND gate 602 then generates the inverted Boolean logical AND of its two input signals to generate the non-inverted HIT signal for the 16-bit priority encoder 600. A first multiplexer 604 receives a constant logic 1 and a constant logic 0 on its two input signal paths and applies a selected input signal to its output signal path as an inverted high order bit of a 4-bit, non-inverted encoded address (ENCA3). Multiplexer 606 represents a second multiplexing device for receiving either of two 3-bit encoded address values (ENCAN0 through ENCAN2), a first from first 8-bit priority encoder 500 and a second from the second 8-bit priority encoder 500. The HITN signal of the first 8-bit priority encoder 500 is also used as a selection input to the multiplexers that comprise multiplexer array 606. Multiplexer 606 is then operable to apply the selected 3-bit, inverted encoded address as non-inverted low order three bits (ENCA0 through ENCA2) of the 4-bit encoded address of the 16-bit priority encoder 600.

Thus, utilizing only static, combinatorial logic and simple multiplexing circuits, 16-bit priority encoder 600 implements a priority encoder devoid of ROM or other memory structures that give rise to problems in present high density integrated circuits. The index value of the highest priority of the hitline input signal pads HL0 through HL15 is encoded as a 4-bit encoded address on ENCA0 through ENCA15 and the generated HIT signal indicates that a valid encoded address is presently applied to the encoded address.

Those of ordinary skill in the art will recognize that further hierarchical layers of logic may be implemented utilizing the structures built from this exemplary fourth layer logic 16-bit priority encoder 600. By alternating the inversion and the logic gating NOR gates and NAND gates, any number of such hierarchical layers may be implemented to provide for any number of hitline input signals. Further, those of ordinary skill in the art will readily recognize that a higher layer structure may easily incorporate any number of lower layer logic structures. With minor modifications to the exemplary embodiment shown in FIGS. 3-6, a priority encoder may also include three or more lower layers of logic to produce still other configurations of priority encoders. Still further, lower layer logic from various layers may be combined to form a higher layer with minor modifications to the logic. For example, an 8-bit priority encoder and a 4-bit priority encoder, properly combined with combinatorial logic and multiplexers, may be combined in a higher layer of logic to form a 12-bit priority encoder circuit. Such design choices will be readily apparent to those of ordinary skill in the art. FIGS. 3 through 6 are therefore intended merely as exemplary of one possible implementation for a priority encoder utilizing combinatorial logic and simple multiplexing circuits devoid of ROM and other memory structures. Other hierarchical logic structures will be readily apparent to those of ordinary skill in the art for providing features and aspects hereof devoid of ROM and other memory structures.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A priority encoder circuit comprising:

a first 4-bit priority encoder comprising:

a pair of first layer circuits wherein the first circuit of the pair of first layer circuits has a higher priority hitline input signal path (HL0) and a lower priority hitline input signal path (HL1) and wherein the second circuit of the pair has a higher priority hitline input signal path (HL2) and a lower priority hitline input signal path (HL3) and wherein both HL2 and HL3 are lower in priority than HL1;

wherein the first circuit further comprises:

a NOR logic gate having a first input signal path coupled to HL0 and having a second input signal path coupled to HL1 and having an output signal path on which is applied the inverted Boolean logical OR of signals on the two input signal paths as a first negated hit signal (HITN) indicative that at least one of the first and second input signal paths has a corresponding active hitline signal applied thereto; and an output signal path (ENCAN) coupled to HL0 to generate an inverted 1-bit encoded address signal indicating the binary encoded index value of the highest priority hitline input signal path from among HL0 and HL1 that is presently active, wherein the second circuit further comprises:

a NOR logic gate having a first input signal path coupled to HL2 and having a second input signal path coupled to HL3 and having an output signal path on which is applied the inverted Boolean logical OR of signals on the two input signal paths as a first negated hit signal (HITN) indicative that at least one of the first and second input signal paths has a corresponding active hitline signal applied thereto; and an output signal path (ENCAN) coupled to HL2 to generate an inverted 1-bit encoded address signal indicating the binary encoded index value of the highest priority hitline input signal path from among HL2 and HL3 that is presently active; and a second layer circuit coupled to each of the pair of first layer circuits and configured to generate a 2-bit encoded address indicating the binary encoded index value of the highest priority hitline input signal path from among HL0, HL1, HL2, and HL3 that is presently active, wherein the second layer circuit further comprises:

a first multiplexer having a first input signal path coupled to a constant logic high signal and having a second input signal path coupled to a constant logic low signal and having a selection input signal path coupled to the HITN of the first circuit of the pair of first layer circuits and having an output signal path on which is applied the selected input signal as a high order bit (ENCA1) of the 2-bit encoded address;

a second multiplexer having a first input signal path coupled to receive the ENCAN signal of the first circuit of the pair of first layer circuits and having a second input coupled to receive the ENCAN signal of the second circuit of the pair of first layer circuits and having a selection input signal path coupled to the HITN of the first circuit of the pair of first layer circuits and having an output signal path on which the selected input signal is applied as a low order bit (ENCA0) of the 2-bit encoded address; and a NAND gate having a first input signal path coupled to the HITN signal of the first circuit of the pair of first layer circuits and a having a second input signal path coupled to the HITN signal of the second circuit of the pair of first layer circuits and having an output signal path (HIT) on which the Boolean inverted logical AND of the two input signals is applied as a hit signal indicating a valid encoded address is applied to ENCA0 and ENCA1.

2. The priority encoder of claim 1 further comprising:

a second 4-bit priority encoder identical in structure to the first 4-bit priority encoder but coupled to receive a highest priority hitline input signal path (HL4) and a next lower priority hitline input signal path (HL5) and a next lower priority hitline input signal path (HL6) and a next lower priority hitline input signal path (HL7) and wherein HL4, HL5, HL6, and HL7 are all lower in priority than HL3; and a third layer circuit coupled to the first and second 4-bit priority encoders and configured to generate a 3-bit encoded address indicating the binary encoded index value of the highest priority hitline input signal path from among HL0, HL1, HL2, HL3, HL4, HL5, HL6, and HL7 that is presently active, wherein the third layer circuit further comprises:

a first multiplexer having a first input signal path coupled to a constant logic high signal and having a second input signal path coupled to a constant logic low signal and having a selection input signal path coupled to the HIT of the first 4-bit priority encoder and having an output signal path on which is applied the selected input signal as an inverted high order bit (LNCAN2) of the 3-bit encoded address;

a second multiplexer array having first input signal paths coupled to receive the ENCA0 and ENCA1 signals of the 4-bit priority encoder and having a second input coupled to receive the ENCA0 and ENCA1 signals of the second 4-bit priority encoder and having a selection input signal path coupled to the HIT output signal path of the first 4-bit priority encoder and having an output signal path on which the selected input signals are applied as inverted low order bits (ENCAN0 and ENCAN1) of the 3-bit encoded address; and a NOR gate having a first input signal path coupled to the HIT signal of the first 4-bit priority encoder and a having a second input signal path coupled to the HIT signal of the second 4-bit priority encoder and having an output signal path (HITN) on which the Boolean inverted logical OR of the two input signals is applied as a hit signal indicating a valid encoded address is applied to ENCAN0, ENCAN1, and LNCAN2, wherein the priority encoder is a first 8-bit priority encoder.

3. The priority encoder of claim 2 further comprising:

a second 8-bit priority encoder identical in structure to the first 8-bit priority encoder but coupled to receive hitline input signal paths HL8 through HL15 ordered from higher to lower priority wherein HL8 through HL15 are all lower in priority than HL7; and a fourth layer circuit coupled to the first and second 8-bit priority encoders and configured to generate a 4-bit encoded address indicating the binary encoded index value of the highest priority hitline input signal path from among HL0 through HL15 that is presently active, wherein the fourth layer circuit further comprises:

a first multiplexer having a first input signal path coupled to a constant logic high signal and having a second input signal path coupled to a constant logic low signal and having a selection input signal path coupled to the HITN of the first 8-bit priority encoder and having an output signal path on which is applied the selected input signal as a high order bit (ENCA3) of the 4-bit encoded address;

a second multiplexer array having first input signal paths coupled to receive the ENCAN0, ENCAN1, and ENCAN2 signals of the first 8-bit priority encoder and having second input signal paths coupled to receive the ENCAN0, ENCAN1, and ENCAN2 signals of the second 8-bit priority encoder and having a selection input signal path coupled to the HITN of the first 8-bit priority encoder and having an output signal path on which the selected input signals are applied as low order bits (ENCA0 through ENCA2) of the 4-bit encoded address; and a NAND gate having a first input signal path coupled to the HITN signal of the first 8-bit priority encoder and a having a second input signal path coupled to the HITN signal of the second 8-bit priority encoder and having an output signal path (HIT) on which the Boolean inverted logical AND of the two input signals is applied as a hit signal indicating a valid encoded address is applied to ENCA0 through ENCA3, wherein the priority encoder is a 16-bit priority encoder.

* * * * *